(12) United States Patent
Chu et al.

(10) Patent No.: US 10,885,998 B1
(45) Date of Patent: Jan. 5, 2021

(54) DIFFERENTIAL FUSE-READOUT CIRCUIT FOR ELECTRONIC DEVICES

(71) Applicant: Micron Technology, Inc., Boise, ID (US)

(72) Inventors: Wei Lu Chu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/681,413

(22) Filed: Nov. 12, 2019

(51) Int. Cl.
*G11C 17/18* (2006.01)
*G11C 17/16* (2006.01)

(52) U.S. Cl.
CPC ............. *G11C 17/18* (2013.01); *G11C 17/16* (2013.01)

(58) Field of Classification Search
CPC .................................. G11C 17/18; G11C 17/16

USPC .......................................................... 365/96
See application file for complete search history.

(56) References Cited

U.S. PATENT DOCUMENTS

| 7,656,710 | B1 * | 2/2010 | Wong ................. G11C 16/3459 365/185.19 |
| 10,304,554 | B1 | 5/2019 | Sreeramaneni et al. |
| 2016/0111163 | A1 * | 4/2016 | Wong ................. G11C 11/5628 365/185.18 |

* cited by examiner

*Primary Examiner* — Xiaochun L Chen
(74) *Attorney, Agent, or Firm* — Fletcher Yoder, P.C.

(57) ABSTRACT

A circuit may include a voltage line and latch circuitry. The latch circuitry may be characterized by a switching voltage threshold and may be coupled to the voltage line. The latch circuitry may generate an output used to determine a state of a fuse. The circuit may also include generation circuitry coupled to the latch circuitry via the voltage line, wherein the generation circuitry is configured to pre-charge the voltage line to a first voltage between a system logical low voltage and the switching voltage threshold.

20 Claims, 11 Drawing Sheets

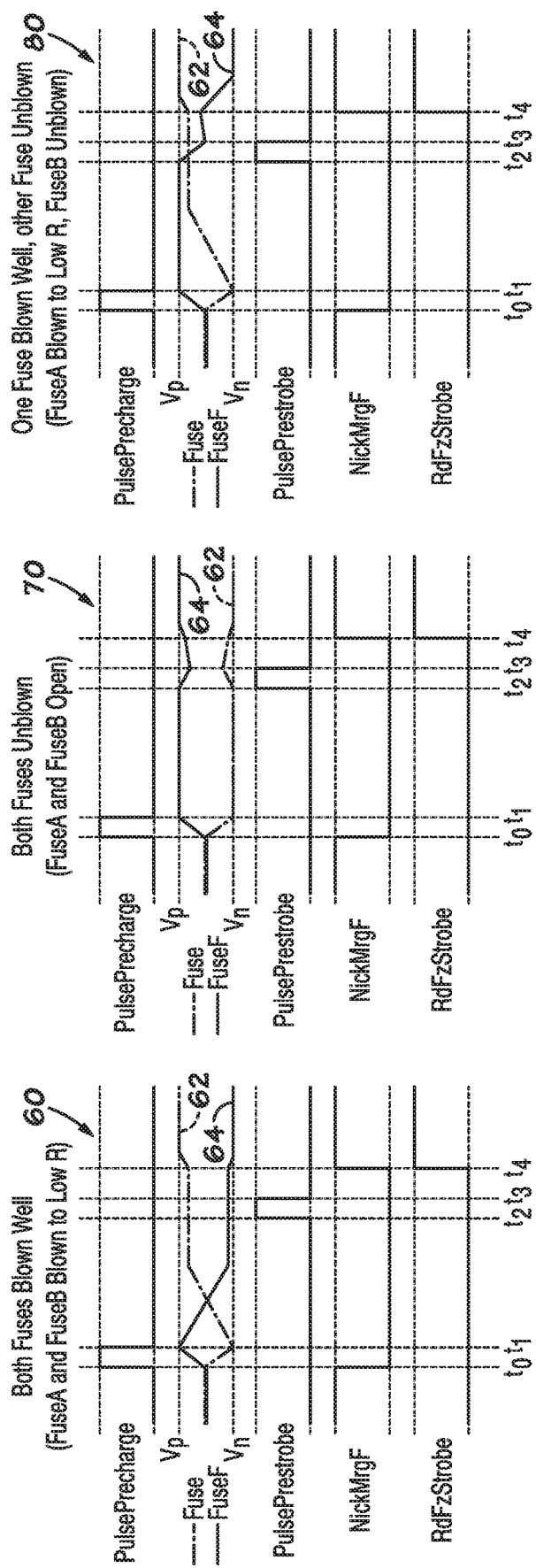

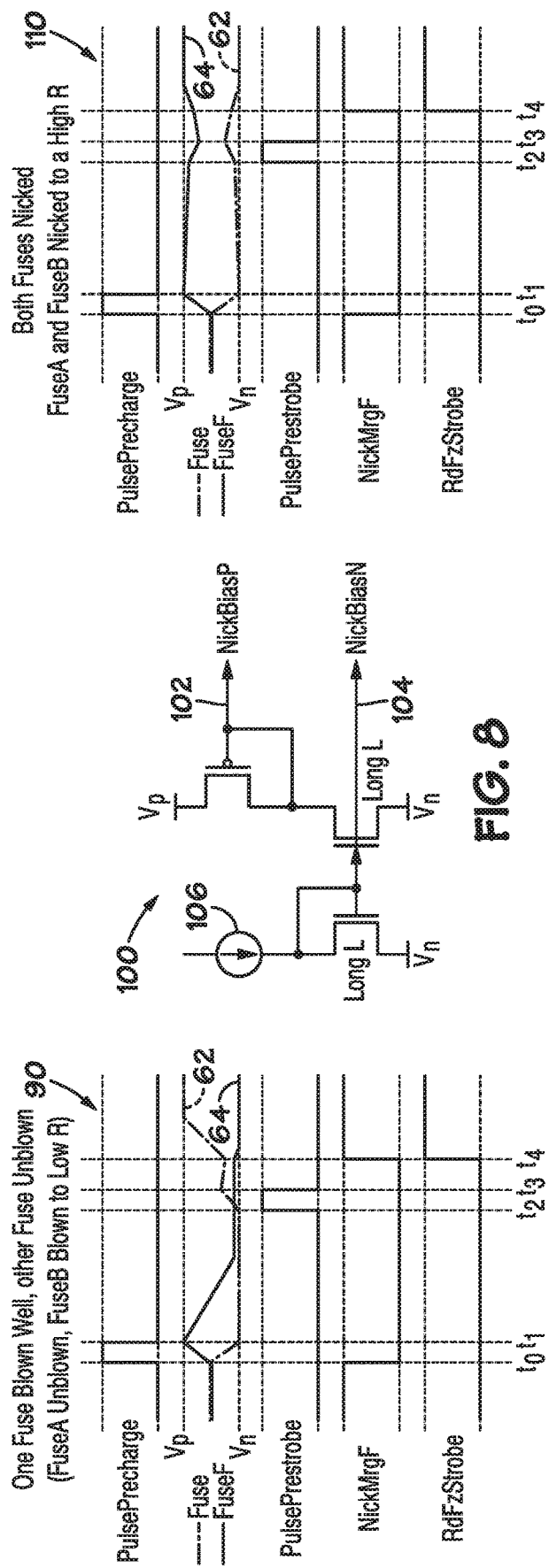

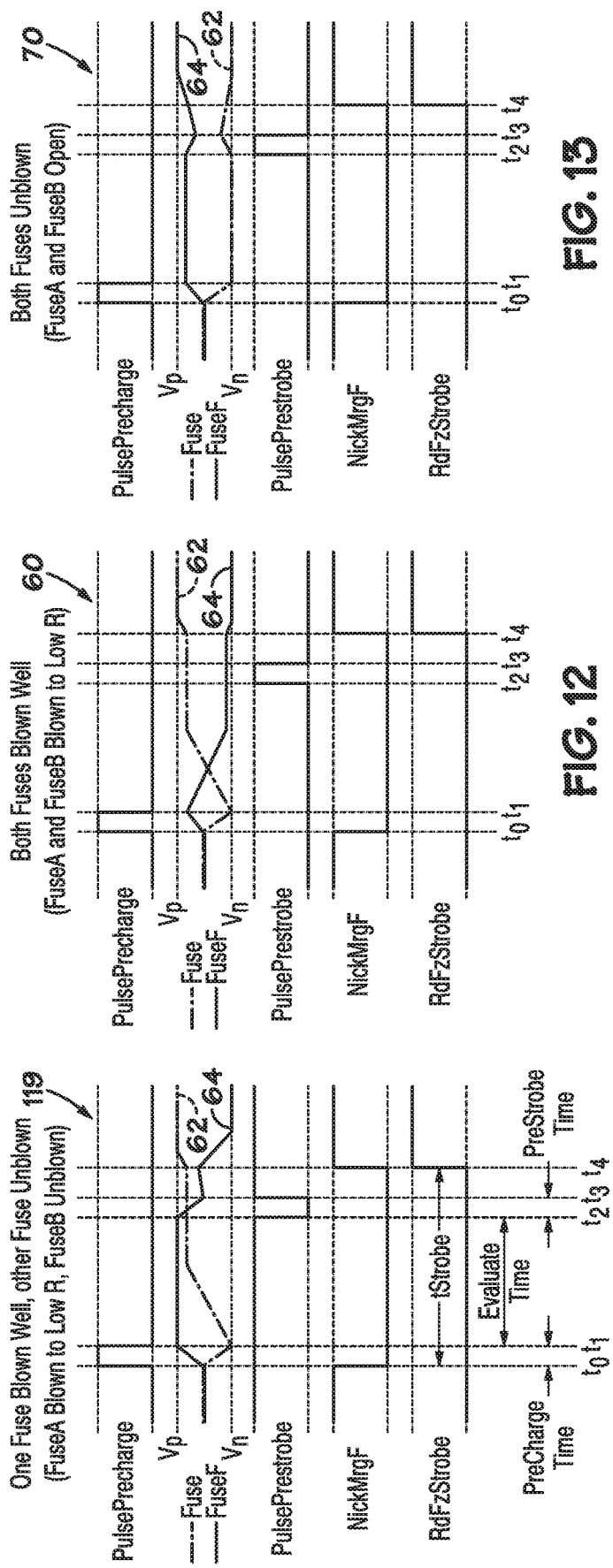

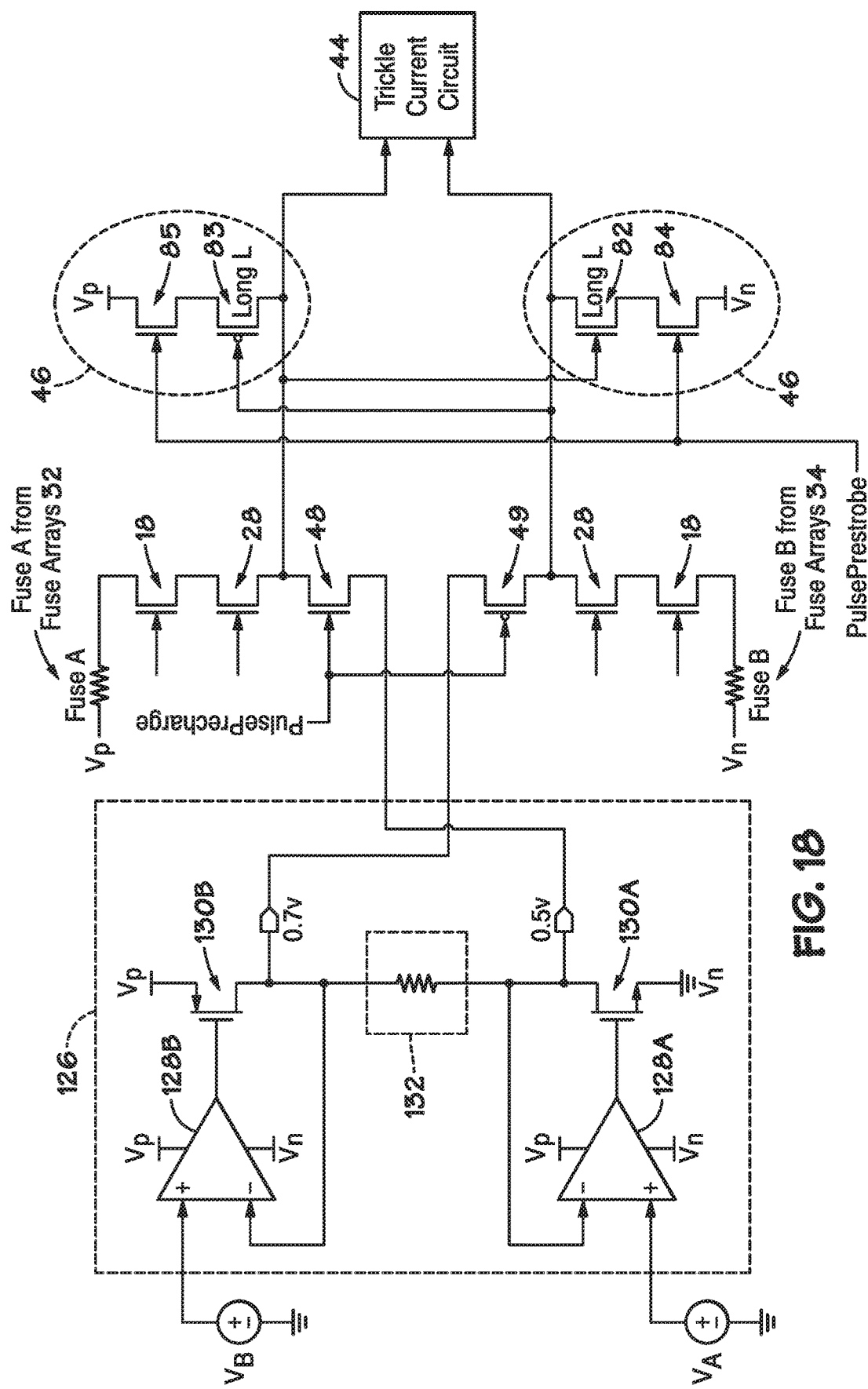

DIFFERENTIAL FUSE-READOUT CIRCUIT FOR ELECTRONIC DEVICES

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, electronic devices, such as semiconductor devices, memory chips, microprocessor chips, image chips, and the like, may include a set of fuses for storing information. For example, the electronic devices, such as semiconductor dies, can include one or more fuse arrays (e.g., a set or a network of fuses or anti-fuses that are programmed to store information). The electronic devices may include the one or more fuse arrays in one or more locations within the respective electronic devices to provide support for different circuit components of the respective electronic devices. For instance, a fuse array may be used to provide a voltage shift for a circuit integrated on a semiconductor die or provide information (e.g., redundancy information, wafer lot number, die lot number, die position on the wafer) regarding a respective circuit component on the semiconductor die.

To save space and make the electronic device more compact, fuse arrays for different circuit components of an electronic device may be positioned in one location in the electronic device, thereby replacing discrete fuses that were located throughout the device in other designs. The semiconductor die can read information (e.g., redundancy information, wafer lot number, die lot number, die position on the wafer) from the fuse array and transmit the information to a respective circuit component disposed at some location within the electronic device.

With this in mind, it should be noted that conditions of the electronic devices can affect the reliability of the fuse reading process. For example, a condition or a setting of the power supplies (e.g., an output thereof), such as during a stabilization period following device startup, initialization, or configuration, can cause an erroneous fuse read. Any such read errors can cause persistent issues throughout the device's operation until the next startup, initialization, or configuration. As such, it is desirable to provide improved systems and methods for ensuring accurate and efficient fuse-reading operation. However, these improved systems and methods may take a relatively long amount of time to read a fuse state, for example, due to an amount of time used to charge a regenerative latch circuit to a switching threshold such that an output associated with the fuse state is able to be read. In this way, it may be desirable to provide systems and methods for improving (e.g., reducing) a duration of time used to perform a fuse-reading operation.

BRIEF DESCRIPTION OF DRAWINGS

Various aspects of this disclosure may be better understood upon reading the following detailed description and upon reference to the drawings in which:

FIG. 4 illustrates a timing diagram of a number of waveforms representative of a first operation scenario of the differential fuse-readout circuit in the electronic device of FIG. 1, according to an embodiment of the present disclosure;

FIG. 5 illustrates a timing diagram of a number of waveforms representative of a second operation scenario of the differential fuse-readout circuit in the electronic device of FIG. 1, according to an embodiment of the present disclosure;

FIG. 6 illustrates a timing diagram of a number of waveforms representative of a third operation scenario of the differential fuse-readout circuit in the electronic device of FIG. 1, according to an embodiment of the present disclosure;

FIG. 7 illustrates a timing diagram of a number of waveforms representative of a fourth operation scenario of the differential fuse-readout circuit in the electronic device of FIG. 1, according to an embodiment of the present disclosure;

FIG. 8 illustrates a schematic diagram of a circuit that may be a component of the differential fuse-readout circuit in the electronic device of FIG. 1, according to an embodiment of the present disclosure;

FIG. 9 illustrates a timing diagram of a number of waveforms representative of a fifth operation scenario of the differential fuse-readout circuit in the electronic device of FIG. 1, according to an embodiment of the present disclosure;

FIG. 10 illustrates different phases of operation of the differential fuse-readout circuit in the electronic device of FIG. 1, according to an embodiment of the present disclosure;

FIG. 12 illustrates a timing diagram of a number of waveforms representative of a first operation scenario of the differential fuse-readout circuit of FIG. 11, according to an embodiment of the present disclosure;

FIG. 13 illustrates a timing diagram of a number of waveforms representative of a second operation scenario of the differential fuse-readout circuit of FIG. 11, according to an embodiment of the present disclosure;

FIG. 18 illustrates a circuit diagram of an example of generation circuitry coupled between a first voltage source, a second voltage source, and the third differential fuse-readout circuit of FIG. 17, according to an embodiment of the present disclosure;

DETAILED DESCRIPTION

Figure 1:
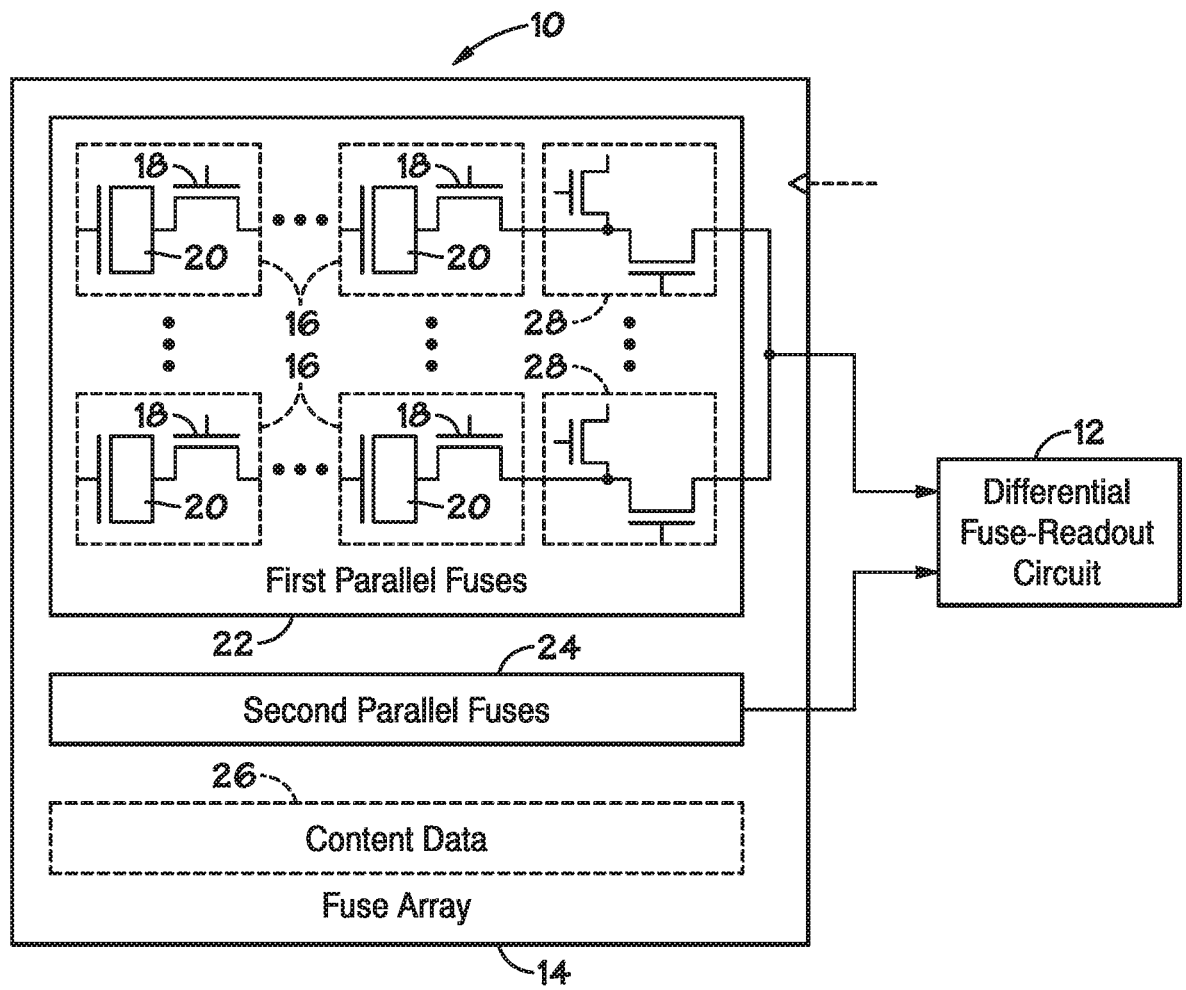
FIG. 1 is a simplified block diagram illustrating an electronic device that includes a differential fuse-readout circuit for reading states of fuses in different fuse arrays, according to an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Fuse arrays may include a collection of fuses or anti-fuses coupled in parallel with each other, such that the fuses or the anti-fuses may store certain information thereon that may be used by other circuit components of an electronic device (e.g., semiconductor die, chip). To ensure that the data stored on each fuse is read out correctly, an additional fuse may be used to store the same data stored on a respective fuse for redundancy. As such, a fuse-readout circuit may access both fuses associated with a particular dataset to verify that the data read out of one fuse is correct. That is, since both fuses store the same data for redundancy, the fuse-readout circuit should read the same data signal (e.g., voltage) from each fuse, thereby confirming that the read data signal is accurate.

Although the redundant fuse layout may provide an effective way for determining whether the read data is correct, the readout of both fuses may be affected by various conditions such as poorly blown fuses, nicked fuses, and the like. As such, to ensure that the fuses are likely to be blown properly, the fuses may be blown using a soak current that is above some threshold value.

To improve the resolution (e.g., amount of current or voltage associated with a fuse) and the speed in which the fuse-readout circuit operates, the present disclosure includes a differential fuse-readout circuit that uses a differential signal acquired from the two redundant fuses to verify that the data read from the two fuses is correct. By relying on the differential signals from the two fuses, the differential fuse-readout circuit may provide improved reliability in reading the condition of high resistance fuses (e.g., weakly blown fuses) at higher speeds, as compared to the fuse-readout circuit that separately reads the data from each fuse. Moreover, the differential fuse-readout circuit enables the soak current used to blow fuses in the fuse array to decrease, thereby enabling the footprint of the fuses used in the fuse array and the support circuitry used to enable the differential fuse-readout circuit to read the fuse data to be scaled down. Additional details with regard to the functionality of the differential fuse-readout circuit will be discussed below with reference to FIGS. 1-20.

Turning now to the figures, FIG. 1 is a simplified block diagram of an electronic device 10 that may employ a differential fuse-readout circuit 12 mentioned briefly above. The electronic device 10 may include one or more fuse arrays 14 that each include multiple fuse cells 16 that may store information according to their programming settings (e.g., for blown or unblown fuse setting). In some embodiments, the fuse arrays 14 may be physically located at a specific portion of the electronic device 10 (e.g., at a central or dedicated portion within the die).

In some embodiments, the fuse cells 16 may each include a fuse transistor 18 and a setting circuit 20 (e.g., for anti-fuses or gate-oxide fuses). The fuse transistor 18 may be used to select the particular fuse cell 16 for the reading operation (e.g., based on connecting to a reading circuit). The setting circuit 20 may include configurable circuitry (e.g. an oxide layer) that may represent information. For example, the fuse cells 16 can be anti-fuses or gate oxide fuses that provide a relatively high resistance (e.g., associated with an open circuit) when the cell is not programmed or unblown. When programmed or blown, the fuse cell 16 may provide a relatively low resistance (e.g., as associated with an electrical short), such as through a weakened or damaged oxide layer.

In some embodiments, the fuse array 14 may include parallel fuse sets that can be programmed to provide redundant or backup data and/or for reading the data in parallel. For example, the fuse array 14 may include first parallel fuses 22 and second parallel fuses 24. The first parallel fuses 22 and the second parallel fuses 24 can be programmed with the same or redundant settings/patterns for representing content data 26 (e.g., redundancy information, wafer lot number, die lot number, die position on wafer, voltage adjustment level) that may be used throughout the electronic device 10 (e.g., by circuits other than the fuse array 14).

The electronic device 10 may read the information stored in the first parallel fuses 22 simultaneously with or in parallel to the information stored in the second parallel fuses 24 (e.g., using multiple reading circuits) for accuracy. In certain embodiments, the electronic device 10 may store the content data 26 in the fuse array 14 based on the fuse settings (e.g., as a form of persistent or non-volatile storage) for use at one or more designated instances (e.g., at device power-up, initialization, configuration, etc.). At the designated instances, the electronic device 10 may use a fuse selection circuit 28 (e.g., a set of switches) to access (e.g., based on connecting a reading circuit thereto) one or more targeted fuse cells 16. The fuse selection circuit 28 may connect the targeted fuse cell 16 to the differential fuse-readout circuit 12. As will be discussed in greater detail below, the differential fuse-readout circuit 12 may read data from two fuses that are associated with each other to determine the data stored on each respective fuse cell 16.

Figure 2:
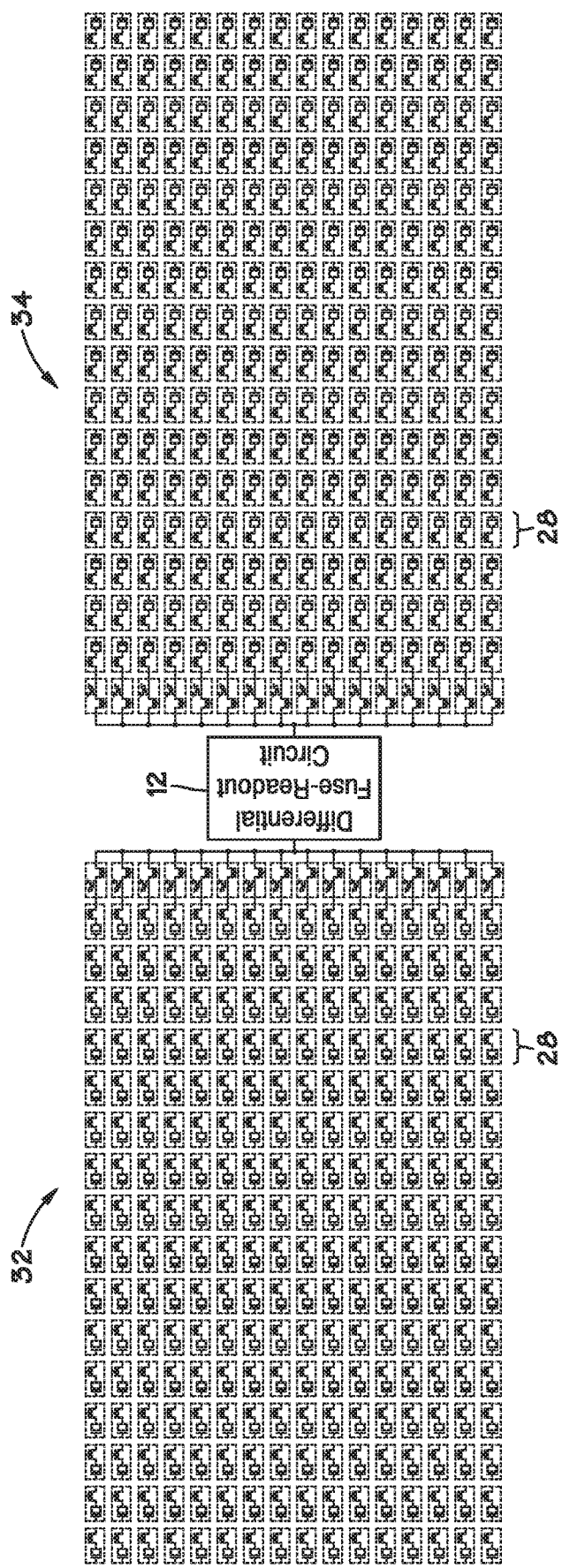
FIG. 2 is a schematic diagram illustrating the differential fuse-readout circuit and the fuse arrays in the electronic device of FIG. 1, according to an embodiment of the present disclosure.

By way of example, FIG. 2 illustrates two fuse arrays 32 and 34, such that the first parallel fuses 22 may be part of one fuse array 32 and the second parallel fuses 24 may be part of a separate fuse array 34. The two fuse arrays 32 and 34 may be coupled to the differential fuse-readout circuit 12. In one embodiment, a fuse cell 16 of the first fuse array 32 may store data, and a corresponding fuse cell 16 of the second fuse array 34 may store the same data to serve as a redundant data storage. In the example depicted in FIG. 2, the first fuse array 32 and the second fuse array 34 each include 256 fuse cells 16, and the differential fuse-readout circuit 12 may be capable of reading the data (e.g., voltage, state) from each fuse cell 16 from both fuse arrays 32 and 34, as opposed to using a fuse read circuit for each fuse array 32 and 34.

To effectively determine a differential signal, the differential fuse-readout circuit 12 may receive a positive voltage from one fuse array when a connected fuse is blown and a negative voltage from the other fuse array when the corresponding connected fuse is blown. As such, in one example, the fuse cells 16 of the fuse array 32 may be coupled to a positive voltage source (Vp) and the fuse cells 16 of the fuse array 34 may be coupled to a negative voltage source (Vn). Although the following description of the differential fuse-readout circuit 12 is detailed with regard to the positive voltage source (Vp) and the negative voltage source (Vn), the embodiments described herein may also employ a ground source in place of either of these voltage sources. That is, the positive voltage source (Vp) and the negative voltage source (Vn) are used to convey different voltage states (e.g., high and low) and other suitable voltage sources and levels may be used in accordance with the embodiments described herein.

As will be described in greater detail below, by using the differential fuse-readout circuit 12, the electronic device 10 may receive data signals representing the data stored in a fuse cell 16 with a higher resolution (e.g., higher amplitude voltage, more representative of actual data stored in fuse cell 16) and at a faster speed. That is, the difference between the signals representative of data stored in the fuse cells 16 from the different fuse arrays 32 and 34 may be used to more accurately determine and verify the fuse state (e.g., blown) or voltage of each fuse cell 16, as opposed to individually sending the data stored in each fuse cell 16 of each fuse array 32 and 34. Moreover, by using the differential fuse-readout circuit 12, the electronic device 10 may simultaneously read the fuse cells 16 from two different fuse arrays 32 and 34, thereby eliminating at least one read operation performed when individually reading each fuse cell 16.

Thus, the improved resolution in the data signals detected by the differential fuse-readout circuit 12 permits reading of high resistance and non-linear fuses at high speed with better accuracy (e.g., relatively higher accuracy). Moreover, by relying on differential signaling and time-based margining, the differential fuse-readout circuit 12 may more reliably read high resistance fuses (e.g., weakly blown fuses) at high speed. As a result, the soak current for blowing fuse cells 16 may decrease, and, consequently, this permits aggressive scaling down of the footprint of individual fuse cells 16 used in the electronic device 10. The ability of the differential fuse-readout circuit 12 to operate at higher speeds, as compared to individual readout circuits for different fuse arrays, may enable the number of fuses able to be provided on a die to increase, thereby enabling a higher density die.

Figure 3:
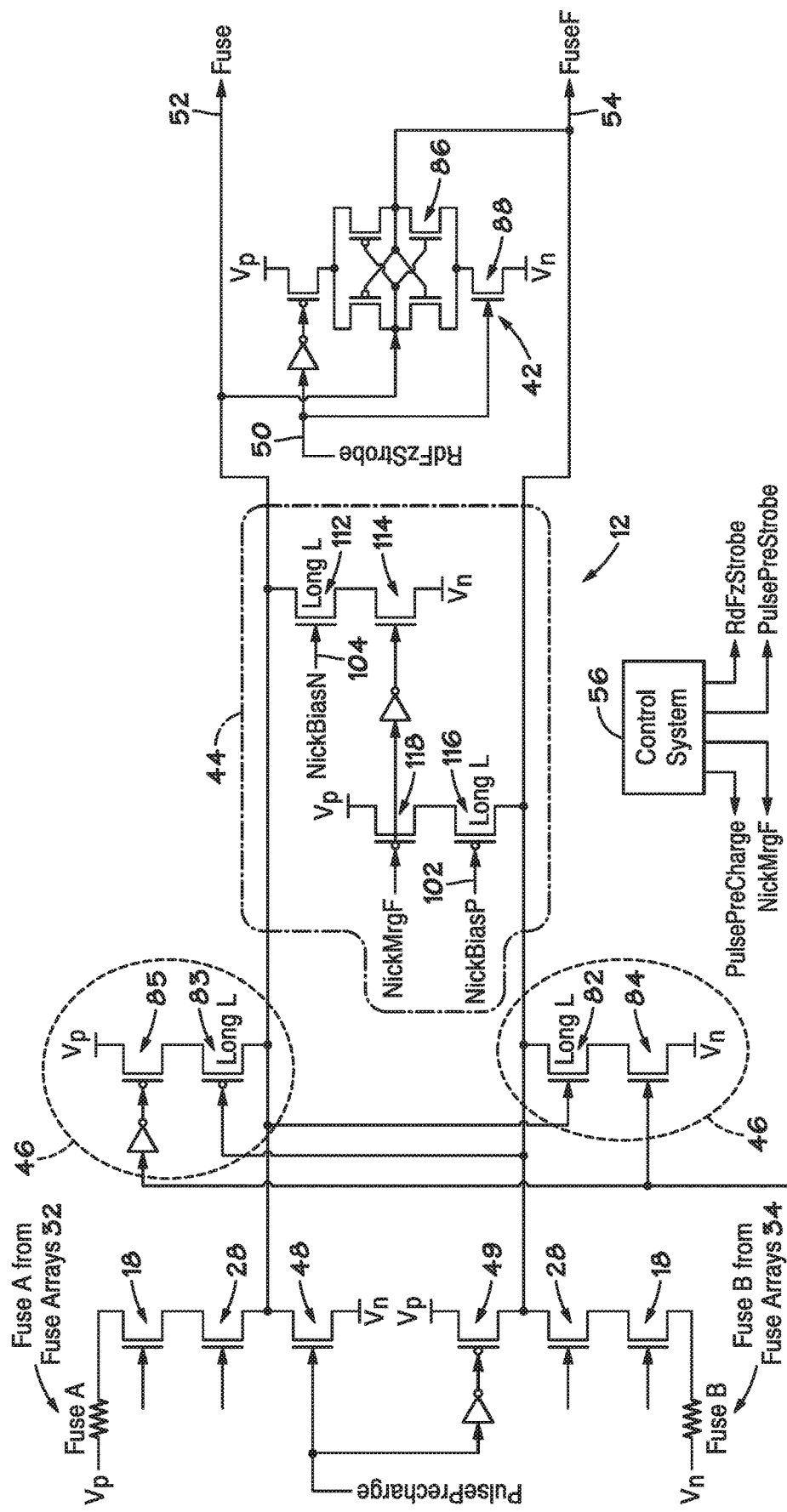
FIG. 3 is a schematic diagram illustrating circuit components that may be part of the differential fuse-readout circuit in the electronic device of FIG. 1, according to an embodiment of the present disclosure.

With the foregoing in mind, FIG. 3 illustrates a schematic diagram illustrating circuit components of the differential fuse-readout circuit 12. As shown in FIG. 3, the differential fuse-readout circuit 12 may include a regenerative latch circuit 42, a trickle current circuit 44, pre-strobe devices 46, and pre-charge devices 48 and 49. In one embodiment, a fuse cell 16 (e.g., Fuse A and Fuse B) from each fuse array 32 and 34 may be coupled to the differential fuse-readout circuit 12 via the fuse transistor 18 used to select a particular fuse cell 16, and the fuse selection circuit 28 used to access the particular fuse cell 16 from a group of fuse cells 16.

The regenerative latch circuit 42 may be a sense amplifier circuit that may increase the detected voltage of a respective fuse cell 16. In one embodiment, the regenerative latch circuit 42 may be a cross-coupled p-channel and n-channel switch circuit. By way of operation, when a read fuse strobe signal 50 provided to the regenerative latch circuit 42 is off or low (e.g., 0), the voltage line 52 and the voltage line 54 that correspond to the voltages associated with the connected fuse cell 16 from fuse array 32 and fuse array 34, respectively, drift to voltages that correspond to the voltages of the connected fuse cell 16 from fuse array 32 and fuse array 34. However, when the read strobe signal 50 is high, the regenerative latch circuit 42 may use the differential voltage between the voltage line 52 and the voltage line 54 to amplify the corresponding voltage signals.

In certain embodiments, prior to reading the states or voltages of a pair of fuses in the fuse array 32 and the fuse array 34, the pre-charge devices 48 and 49 may be switched on or electrically couple the voltage line 52 and the voltage line 54 to a voltage source having the opposite polarity of the corresponding fuse cell 16 of the respective fuse array 32 or 34. For example, pre-charge device 48 may be coupled to a low voltage source, a negative voltage source (Vn), or ground, which may be an opposite or different polarity as compared to the positive voltage source (Vp) coupled to Fuse A of the fuse array 32. In the same manner, the pre-charge device 49 may be coupled to a high voltage source (e.g., positive), which may correspond to an opposite or different polarity as compared to the negative voltage source (Vn) coupled to Fuse B of the fuse array 34.

It should be noted that the pre-charge devices 48 and 49 may be any suitable switching device such as a transistor, metal-oxide-semiconductor field-effect transistor (MOSFET), or the like. Indeed, the pre-charge devices 48 and 49 may also include p-type devices, n-type devices, or both provided that they are used to perform the operations described herein. Moreover, although the schematic diagram of FIG. 3 illustrates the positive voltage source (Vp) and the negative voltage source (Vn) coupled to the fuse cells 16 of the fuse arrays 32 and 34 in a particular manner, it should be understood that any suitable voltage sources may be employed in accordance with the embodiments presented herein.

With the foregoing in mind, FIG. 4 illustrates a timing diagram 60 that depicts the expected voltage signals for voltage line 52 and voltage line 54 that may be acquired or detected during a fuse read operation when Fuse A from the fuse array 32 and Fuse B from the fuse array 34 are effectively blown. Fuses may be considered to be effectively blown when the resistance across the blown fuse matches an expected resistance or is within some threshold (e.g., 5%) of the expected resistance. For example, an effectively blown fuse may exhibit low resistance properties across the blown fuse, such that the blown fuse may provide a short circuit path therebetween.

In one embodiment, prior to reading the fuse state of the Fuse A and the Fuse B, the differential fuse-readout circuit 12 may cause the pre-charge devices 48 and 49 to switch on and couple to their respective voltage sources. To coordinate the operations of the pre-charge devices 48 and 49, as well as other components that may be part of the electronic device 10 or the differential fuse-readout circuit 12, the differential fuse-readout circuit 12 may include a control system 56 that may send and receive signals to and from various components within or outside of the electronic device 10 or the differential fuse-readout circuit 12.

For instance, the control system 56 may include a communication component, one or more processors, a memory, a storage, input/output (I/O) ports, a display, and the like. The communication component may be a wireless or wired communication component that may facilitate communication of signals between the various components of the differential fuse-readout circuit 12. The one or more processors may be any type of computer processor or microprocessor capable of executing computer-executable code. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may represent non-transitory computer-readable media (e.g., any suitable form of memory or storage) that may store the processor-executable code used by the processor to perform various techniques described herein. It should be noted that non-transitory merely indicates that the media is tangible and not a signal. The I/O ports may be interfaces that may couple to other peripheral components such as input devices (e.g., keyboard, mouse, microphone), sensors, input/output (I/O) modules, and the like. The display may operate to depict visualizations associated with software or executable code being processed by the processor.

Referring back to the timing diagram 60 of FIG. 4, to cause the pre-charge devices 48 and 49 to switch on, the control system 56 may send a pre-charge pulse signal (e.g., PulsePrecharge, pre-charge signal) at time $t_0$ to the gates of the two pre-charge devices 48 and 49. During the time period in which the pre-charge pulse signal is provided to the gates of the pre-charge devices 48 and 49, the voltage line 52 will be charged to a low voltage value due to the pre-charge device 48 coupling the negative voltage source (Vn) to the voltage line 52. In the same manner, the voltage line 54 will be charged to a high voltage value due to the pre-charge device 49 coupling the positive voltage source (Vp) to the voltage line 54.

After the pre-charge pulse signal is removed from the gates of the pre-charge devices 48 and 49 at time $t_1$, the voltage levels of the voltage line 52 and the voltage line 54 may drift toward a voltage level that corresponds to the voltage source coupled to the blown fuse. For example, referring back to FIG. 3, after the pre-charge pulse signal is removed from the gates of the pre-charge devices 48 and 49, the positive voltage source (Vp) will be coupled to the voltage line 52 and the negative voltage source (Vn) will be coupled to the voltage line 54 since the blown fuses (e.g., Fuse A and Fuse B) will have a minimal (e.g., zero) resistance.

With this in mind, the timing diagram 60 of FIG. 4 illustrates that a voltage signal 62 that corresponds to the voltage of the voltage line 52 drifts toward the positive voltage source (Vp) voltage level between time $t_1$ and time $t_2$. Similarly, a voltage signal 64 that corresponds to the voltage of the voltage line 54 drifts toward the negative voltage source (Vn) voltage level between time $t_1$ and time $t_2$. As shown in FIG. 4, the voltage signals 62 and 64 appear to settle prior to time $t_2$ but fails to reach the voltage levels that correspond to the output voltages of the positive voltage source (Vp) and the negative voltage source (Vn). To amplify or improve the quality of the voltage signals 62 and 64 provided to the voltage lines 52 and 54, the control system 56 may send a read fuse strobe signal (e.g., RdFzStrobe, read signal) to the regenerative latch circuit 42 at time $t_4$.

At time $t_4$, the regenerative latch circuit 42 may amplify the voltage signals 62 and 64 present on the voltage lines 52 and 54. As a result, the voltage signal 62 will correspond to the voltage level of the positive voltage source (Vp) and the voltage signal 64 will correspond to the voltage level of the negative voltage source (Vn). In this way, the differential fuse-readout circuit 12 may effectively determine that Fuse A and Fuse B are blown because the voltage levels of the voltage signals 62 and 64 correspond to the voltage levels of the positive voltage source (Vp) and the negative voltage source (Vn), respectively, which correspond to the voltage sources directly coupled to the respective fuses, Fuse A and Fuse B.

With this in mind, if both Fuse A and Fuse B are both unblown (e.g., open circuit), FIG. 5 illustrates a timing diagram 70 that details how the differential fuse-readout circuit 12 may detect that the respective fuses are indeed unblown. Referring now to FIG. 5, the differential fuse-readout circuit 12 may use the control system 56 to send a pre-charge pulse signal (e.g., PulsePrecharge, pre-charge signal) at time $t_0$ to the gates of the two pre-charge devices 48 and 49. During the time period in which the pre-charge pulse signal is provided to the gates of the pre-charge devices 48 and 49, the voltage line 52 will be charged to a low voltage value due to the pre-charge device 48 coupling the negative voltage source (Vn) to the voltage line 52. In the same manner, the voltage line 54 will be charged to a high voltage value due to the pre-charge device 49 coupling the positive voltage source (Vp) to the voltage line 54.

After the pre-charge pulse signal is removed from the gates of the pre-charge devices 48 and 49 at time $t_1$, the voltage levels of the voltage line 52 and the voltage line 54 may remain stable at a voltage level that corresponds to the pre-charge voltage levels. For example, referring back to FIG. 3, after the pre-charge pulse signal is removed from the gates of the pre-charge devices 48 and 49, the voltage line 52 and the voltage line 54 will not be coupled to another voltage source since the unblown fuses (e.g., Fuse A and Fuse B) will not provide a conductive path to the positive voltage source (Vp) or the negative voltage source (Vn).

With this in mind, at time t1, the timing diagram 70 of FIG. 5 illustrates that the voltage signal 62 that corresponds to the voltage of the voltage line 52 remains at the negative voltage source (Vn) voltage level used to pre-charge the voltage line 52. Similarly, at time $t_2$, the voltage signal 64 that corresponds to the voltage of the voltage line 54 remains at the positive voltage source (Vp) voltage level used to pre-charge the voltage line 54. As will be discussed in greater detail below, at time $t_2$, the voltage signals 62 and 64 may vary due to a pre-strobe pulse signal (e.g., PulsePrestrobe) being applied to the pre-strobe devices 46. However, at time $t_4$, after the regenerative latch circuit 42 receives the read fuse strobe signal (e.g., RdFzStrobe) via the control system 56, the voltage signals 62 and 64 present on the voltage lines 52 and 54 may be amplified to return to the pre-charge voltage values present on the voltage lines 52 and 54 at time $t_1$. As a result, the voltage signal 62 will correspond to the voltage level of the negative voltage source (Vn) and the voltage signal 64 will correspond to the voltage level of the positive voltage source (Vp), thereby indicating to the differential fuse-readout circuit 12 that Fuse A and Fuse B are not blown.

Referring now to the pre-strobe devices 46 of FIG. 3, the differential fuse-readout circuit 12 may use these devices to better detect the voltages of the voltage line 52 and the voltage line 54 when one fuse is blown well and a corresponding fuse is not blown well. That is, the pre-strobe devices 46 may be optionally employed by the differential fuse-readout circuit 12 to provide trickle current in the direction of a blown fuse but proportional to a state of the opposite pre-charge voltages used for the voltage lines 52 and 54 due to the cross-coupled bias control of the differential fuse-readout circuit 12. By way of operation, the pre-strobe devices 46 may increase the fuse trip point while permitting the differential fuse-readout circuit 12 to correctly detect that a fuse has blown, even when only one of the two fuses from the fuse arrays 32 and 34 has blown.

To further illustrate the operation of the pre-strobe devices 46, FIG. 6 depicts a timing diagram 80 that indicates the behavior of the voltage levels of the voltage lines 52 and 54 when Fuse A is effectively blown but the corresponding Fuse B is not. Referring to FIG. 6, the differential fuse-readout circuit 12 may initially use the control system 56 to send a pre-charge pulse signal (e.g., PulsePrecharge) at time $t_0$ to the gates of the two pre-charge devices 48 and 49, as described above. During the time period in which the pre-charge pulse signal is provided to the gates of the pre-charge devices 48 and 49, the voltage line 52 will be charged to a low voltage value due to the pre-charge device 48 coupling the negative voltage source (Vn) to the voltage line 52. In the same manner, the voltage line 54 will be charged to a high voltage value due to the pre-charge device 49 coupling the positive voltage source (Vp) to the voltage line 54.

After the pre-charge pulse signal is removed from the gates of the pre-charge devices 48 and 49 at time $t_1$, the voltage signal 62 of the voltage line 52 may drift toward a voltage level that corresponds to the voltage source coupled to the blown fuse. For example, referring back to FIG. 3, after the pre-charge pulse signal is removed from the gates of the pre-charge devices 48 and 49, the voltage line 52 will be coupled to the positive voltage source (Vp) via the blown Fuse A. Alternatively, unblown Fuse B will not provide a conductive path to the negative voltage source (Vn) because the Fuse B will still serve as an open circuit between the voltage line 54 and the negative voltage source (Vn).

To ensure that Fuse B is detected to be blown like its Fuse A counterpart, the pre-strobe devices 46 may receive the pre-strobe signal via the control system 56 at time $t_2$. Since the voltage line 52 at time $t_2$ is high (e.g., close to the voltage output by the positive voltage source (Vp)), pre-strobe switch 82 may be closed during the period in which the pre-strobe signal is provided to pre-strobe switch 84. As such, voltage line 54, which was previously pre-charged to the voltage level output by the positive voltage source (Vp), will now be coupled to the negative voltage source (Vn) via the pre-strobe switches 82 and 84 for a brief amount of time (e.g., between time $t_2$ and $t_3$). As such, the voltage signal 64 will decrease during this time period until the pre-strobe signal is removed from the pre-strobe devices 46 at time $t_3$.

After time $t_3$, the voltage signal 64 may increase again towards the pre-charge voltage level that corresponds to the positive voltage source (Vp) voltage level. However, at time $t_4$, the regenerative latch circuit 42 may receive the read fuse strobe signal, which may cause the voltage signal 64 to be coupled to the negative voltage source (Vn) via the regenerative latch circuit 42. That is, since the voltage signal 62 is relatively high, switch 86 may be closed, thereby providing a pathway between the voltage line 54 and the negative voltage source (Vn) via the switch 88, which receives the read fuse strobe signal. In this case, although Fuse B is not blown, the regenerative latch circuit 42 may use the voltage signal 62 indicating the blown state of Fuse A to cause voltage line 54 to correspond to the negative voltage source (Vn) voltage level to indicate that Fuse B is also blown. As a result, the voltage signals 62 and 64 of the timing diagram 80 matches the voltage signals 62 and 64 of the timing diagram 60 of FIG. 4, which correspond to when both Fuse A and Fuse B are blown. In this way, the unblown Fuse B may still be read as blown by the differential fuse-readout circuit 12. Moreover, the same operating principles of the pre-strobe devices 46 may be applied for the voltage line 52 using the switches 83 and 85, which may correspond to switches 82 and 84 coupled to the voltage line 54.

With the foregoing in mind, FIG. 7 illustrates a timing diagram 90 that corresponds to the timing diagram 80 of FIG. 6 in that one fuse is blown while the other is not blown. Specifically, the timing diagram 90 corresponds to the scenario in which Fuse A is not blown and Fuse B is blown. As such, the voltage signals 62 and 64 of the timing diagram 90 correspond to the voltage signals 62 and 64 of the timing diagram 80 except with each respective signal having the inverse waveform.

In certain embodiments, the fuse cells 16 of the fuse arrays 32 and 34 may be nicked or damaged. The damage to the fuse cell 16 may cause the respective fuse cell 16 to exhibit electrical properties (e.g., voltage, resistance) that may not correspond to undamaged fuse cells 16. For instance, a damaged fuse cell 16 may not be effectively unblown to provide a high resistance path across the fuse cell 16. Instead, a lower than expected resistance may cause a voltage line (e.g., voltage line 52 or 54) to reach a voltage level that may not be detected by a fuse readout circuit as being blown.

To prevent the differential fuse-readout circuit 12 from reading the nicked or damaged fuses as blown fuses, the trickle current circuit 44 may be controlled by a bias current. For example, FIG. 8 illustrates a bias generator circuit 100 that may provide a positive bias signal 102 and a negative bias signal 104 to the trickle current circuit 44. Referring to FIG. 8, the bias generator circuit 100 may include a current source 106, which may output a constant current. The current source 106 may be a proportional to an absolute temperature current (IPTAT) source that outputs current that varies directly with temperature. The current source 106 generates a leakage current (e.g., a bias current) that may provide a relatively small voltage to bias the voltage signals 62 and 64 on the voltage lines 52 or 54 toward the voltage levels that correspond to an unblown fuse. This relatively small amount of voltage, as compared to the voltage levels output by the positive voltage source (Vp) or the negative voltage source (Vn), may be used to provide bias voltages to the voltage lines 52 and 54 to prevent nicked or damaged fuses, which may have a lower resistance than an undamaged fuse, from causing the differential fuse-readout circuit 12 to incorrectly indicate that a nicked or damaged fuse cell 16 is a blown fuse.

To better illustrate how the trickle current circuit 44 may apply bias voltages to the voltage lines 52 and 54 of the differential fuse-readout circuit 12, FIG. 9 is a timing diagram 110 that illustrates the voltage signals 62 and 64 that correspond to the effects caused by two damaged or nicked fuse cells 16 (e.g., Fuse A and Fuse B). In certain embodiments, the nicked fuse margin signal (e.g., NickMrgF, nicked fuse signal) may transition from high to low at time to, as shown in FIG. 9. As such, the trickle current circuit 44 may couple the voltage line 52 to the negative voltage source (Vn) via a switch 112 and a switch 114. However, since the gate of the switch 112 is coupled to the negative bias signal 104, the switch 112 may not close. Instead, a bias voltage due to the trickle current through the switch 112 may be applied to the voltage line 52 to counteract the voltage signal 62 from drifting towards the positive voltage source (Vp) voltage level. In the same manner, since the gate of the switch 116 is coupled to the positive bias signal 102, the switch 116 may not close and a bias voltage due to the trickle current through the switch 116 and the positive voltage source (Vp) coupled to the switch 118 may be applied to the voltage line 54 to counteract the voltage signal 64 from drifting towards the negative voltage source (Vn) voltage level.

Referring to the timing diagram 110, after the pre-strobe pulse is applied between time $t_2$ and time $t_3$, the read fuse strobe signal is transmitted at time $t_4$, and the nicked fuse margin signal (e.g., NickMrgF) transitions back to high at time $t_4$, the voltage signals 62 and 64 may settle at the voltage levels that correspond to the pre-charge voltages to indicate that Fuse A and Fuse B are not blown. In some embodiments, if the trickle current circuit 44 is not activated (e.g., the nicked fuse margin signal remains high throughout time $t_1$ and $t_2$), the voltage signals 62 and 64 may drift faster towards the respective voltage levels indicative of blown fuses. As such, at time t4, when the regenerative latch circuit 42 activates and another circuit component attempts to read the voltage signals 62 and 64 to determine whether the Fuse A and Fuse B were blown, the voltage signals 62 and 64 may not return to the pre-charge voltage levels before the voltage signals 62 and 64 are sampled or evaluated.

With the foregoing in mind, it can be appreciated how the various circuit components within the differential fuse-readout circuit 12 adjust the voltage signals 62 and 64 in different directions to tune the differential fuse-readout circuit 12 to read the states of Fuse A and Fuse B more accurately. FIG. 10 illustrates how different portions of the timing diagrams described above may be characterized to better facilitate the tuning of the differential fuse-readout circuit 12. For example, as shown in timing diagram 119 of FIG. 10, between times $t_0$ and $t_1$ (e.g., pre-charge time), the pre-charge devices 48 and 49 may pull the respective voltage signals 62 and 64 towards voltage levels that indicate that Fuse A and Fuse B are not blown to initialize the operational cycle of the differential fuse-readout circuit 12.

Between times $t_1$ and time $t_2$ (e.g., evaluate time, evaluation phase), the trickle current circuit 44 may bias the voltage signals 62 and 64 to voltage levels that indicate that the respective signals are not blown. In this manner, the trickle current circuit 44 may counteract the effects of a nicked or damaged fuse cell 16 providing a conductive path from the positive voltage source (Vp) or the negative voltage source (Vn) to the voltage lines 52 or 54. As such, the trickle current circuit 44 may prevent a nicked or damaged fuse cell 16 from altering the voltage signal 62 or 64 to incorrectly cause the differential fuse-readout circuit 12 reading the respective fuse cell 16 (e.g., Fuse A or Fuse B) as blown.

During this evaluation phase, a weakly blown fuse can be read as a blown fuse if the differential fuse-readout circuit 12 is provided a sufficient amount of tStrobe time (e.g., between times $t_0$ and $t_4$). However, the differential fuse-readout circuit 12 may also accidentally read nicked or damaged fuse cells 16 as blown fuses without the trickle current circuit 44. That is, the differential fuse-readout circuit 12 may modulate the behavior of the voltage signals 62 and 64 with a trickle current enabled by the nicked fuse margin signal (e.g., NickMrgF), and the amount of trickle current that is provided by the trickle current circuit 44 may be set by the positive bias signal 102 (e.g., NickBiasP) and the negative bias signal 104 (e.g., NickBiasN). Setting a trickle current sets a ceiling on the highest resistance that is read as a blown fuse. In this way, the differential fuse-readout circuit 12 may provide a tuning knob that may be used to distinguish between blown fuses and nicked or damaged unblown fuses.

Between times $t_2$ and $t_3$ (e.g., pre-strobe time), the pre-strobe devices 46 may pull one of the voltage signals 62 or 64 towards a voltage indicative of a blown fuse state if the one voltage signal 62 or 64 indicates that the respective fuse cell 16 is not blown but the other of the two voltage signals 62 or 64 indicates that the respective fuse cell 16 is blown. That is, the pre-strobe devices 46 may provide a trickle current to the voltage lines 52 and 54 in the direction of a blown fuse but proportional to the state of the opposite reference fuse cell 16 (e.g., Fuse A or Fuse B) due to the nature of the cross-coupled bias control of the pre-strobe devices 46. If this phase is enabled, the fuse trip point may increase while maintaining the ability of the differential fuse-readout circuit to function correctly even if only one of the fuse cells 16 (e.g., Fuse A or Fuse B) is blown.

Keeping this in mind, the differential fuse-readout circuit 12 may be tuned to adjust margins in which fuses are detected to be blown or unblown. That is, by increasing or decreasing the tStrobe time, the differential fuse-readout circuit 12 may effectively adjust the trip point of a fuse read latch (i.e., the resistance of fuses that are read as blown versus unblown). This can provide an effective way to margin test the fuse blows as well. For example, to margin test a blown fuse, the control system 56 may decrease the tStrobe time and increase the trickle current provided by the trickle current circuit 44. In this case, if the differential fuse-readout circuit 12 reads the respective fuse cell 16 as blown, the resultant tStrobe time may correspond to a limit or threshold to read blown fuse cells 16. On the other hand, to margin test nicked or damaged fuse cells, the control system 56 may increase the tStrobe time and decrease the trickle current provided by the trickle current circuit 44, and the differential fuse-readout circuit 12 may verify whether any fuse cells 16 were unintentionally read as blown. The resultant tStrobe time may correspond to a limit or threshold to accurately read nicked or damaged fuse cells 16.

Referring back to the circuit diagram of the differential fuse-readout circuit 12 in FIG. 3, it should be noted that each switch depicted therein may be any suitable switching device, such as a P-type semiconductor switch, an N-type semiconductor switch, a transistor, a MOSFET, or the like. However, in some instances, since the pre-charge device 48, the switch 82, and the switch 112 are N-type devices, the voltage drop (e.g., Vt) across the respective channel of each respective switch may prevent the respective voltage signal 62 or 64 from being pulled to achieve the voltage level that corresponds to the positive voltage source (Vp). That is, due to the voltage drop across the respective N-type switch, the respective voltage signal 62 or 64 may reach a voltage level of Vp-Vt, as opposed to the positive voltage level (Vp).

Figure 11:
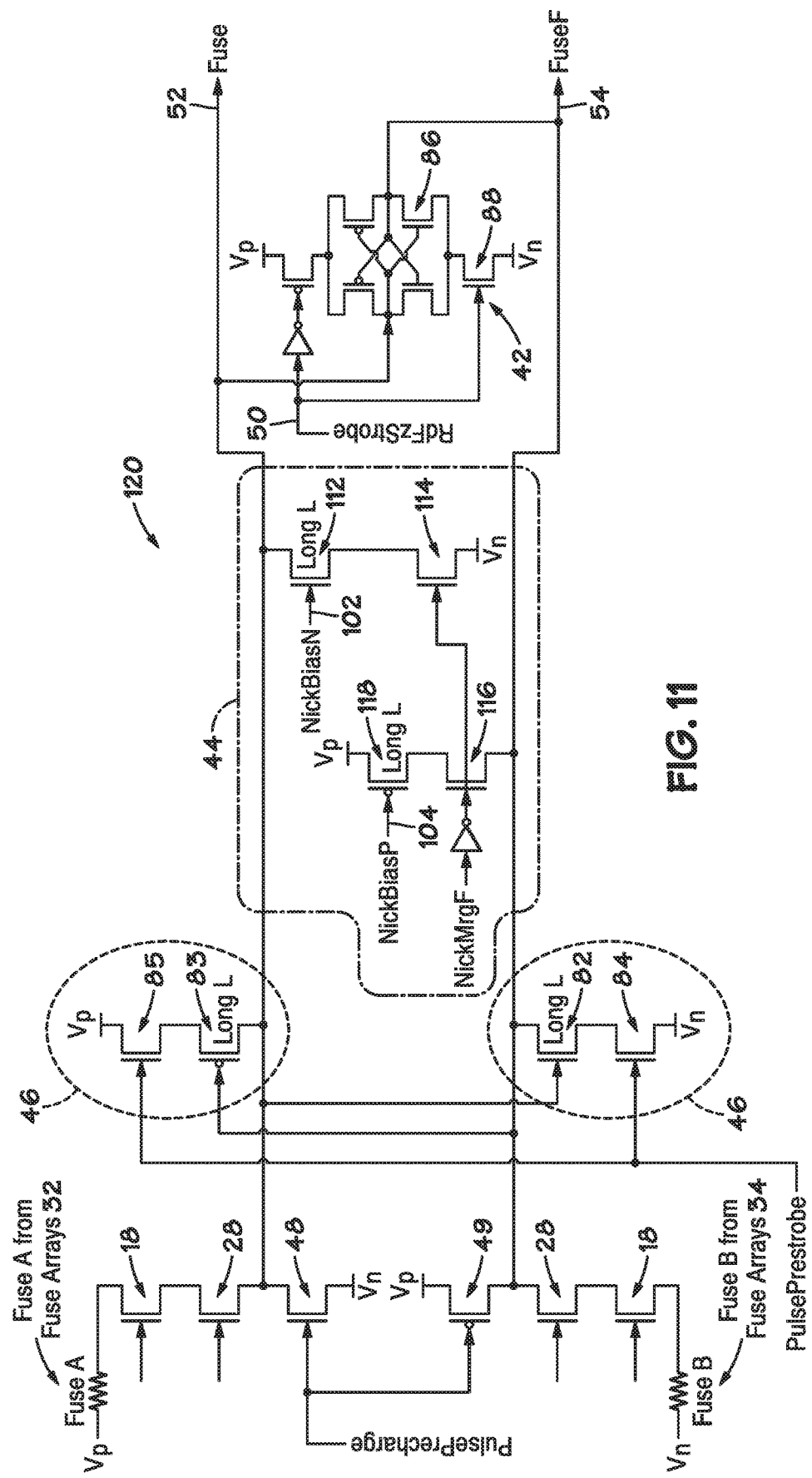
FIG. 11 illustrates circuit components that may be part of a second example differential fuse-readout circuit in the electronic device of FIG. 1, according to an embodiment of the present disclosure.
Figures 14, 15, 16:
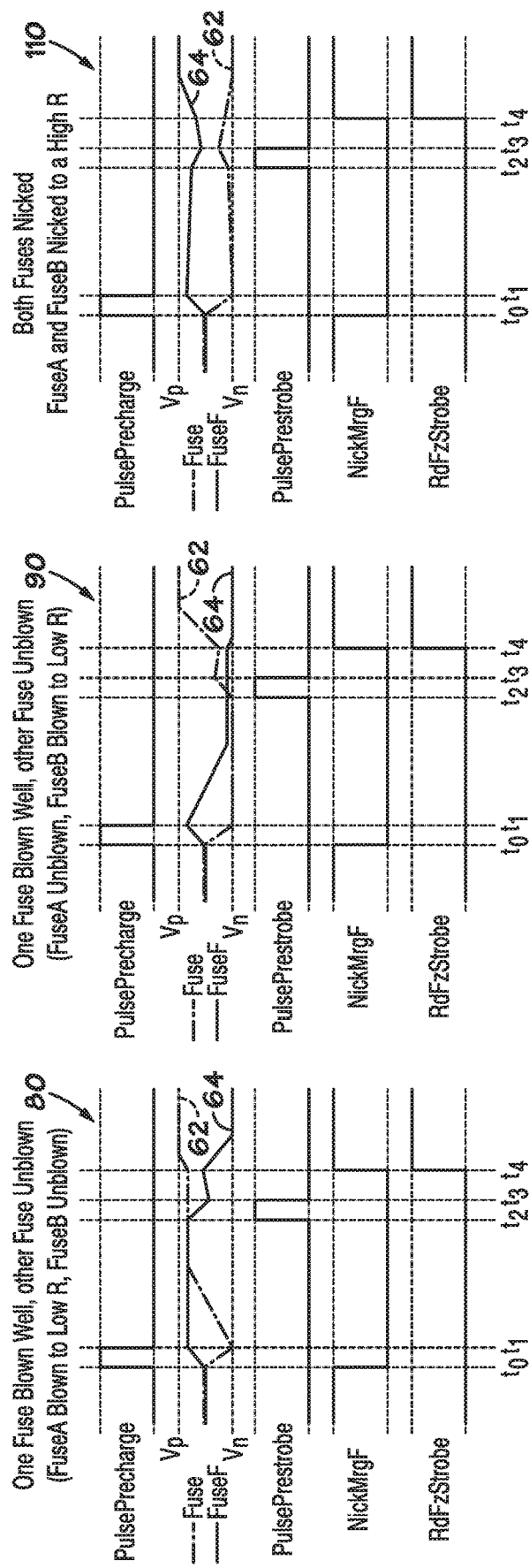
FIG. 14 illustrates a timing diagram of a number of waveforms representative of a third operation scenario of the differential fuse-readout circuit of FIG. 11, according to an embodiment of the present disclosure.
FIG. 15 illustrates a timing diagram of a number of waveforms representative of a fourth operation scenario of the differential fuse-readout circuit of FIG. 11, according to an embodiment of the present disclosure.
FIG. 16 illustrates a timing diagram of a number of waveforms representative of a fifth operation scenario of the differential fuse-readout circuit of FIG. 11, according to an embodiment of the present disclosure.

To provide consistent voltage levels across the differential fuse-readout circuit 12, the pre-charge device 49, the switch 85 and the switch 116 may, in another embodiment, be N-type switches, as shown in the example circuit diagram 120 of a second example of the differential fuse-readout circuit 12 in FIG. 11. In addition to changing certain switches to N-type switches, the trickle current circuit 44 may be altered as shown in the circuit diagram 120, such that the positive bias signal 102 may be provided to switch 118 and the nicked fuse margin signal (e.g., NickMrgF) may be provided to switch 116. As a result, the operating conditions for the voltage lines 52 and 54 to swing between Vp-Vt and Vn consistently until the regenerative latch circuit 42 is fired. By way of example, the operation of the differential fuse-readout circuit 12, as presented in the circuit diagram 120, using N-type switches for pre-charge device 49, the switch 85, and the switch 116 are depicted in timing diagrams of FIGS. 12-16, which correspond to the timing diagrams depicted in FIGS. 4-7 and 9, respectively. As shown FIGS. 12-16, during the evaluate period (e.g., between times t1 and t2), the voltage signal 62 and the voltage signal 64 do not reach the positive voltage source (Vp) level due to the voltage drop associated with the pull-up N-type channel switches used for the pre-charge device 49, the switch 85, and the switch 116.

By employing the differential fuse-readout circuit 12 described above, semiconductor devices or silicon die that uses fuse arrays 32 or 34 to store certain information regarding the device or silicon die may be read more efficiently, as compared to previous fuse readout circuits. That is, the use of the pre-charge devices 48 and 49, the trickle current circuit 44, the pre-strobe devices 46, and the regenerative latch switch 42 as described above, the differential fuse-readout circuit 12 may finely tune its ability to accurately detect blown fuses (e.g., fuse cell 16), unblown fuses, the states of nicked or damaged fuses, and the like. In addition, the differential fuse reads performed by the differential fuse-readout circuit 12 may enable the circuit to accurately detect that one fuse has been blown even when the other fuse has not been blown though it should have been blown. That is, the inability of one fuse to blow does not prevent the ability of the differential fuse-readout circuit 12 to provide data to other devices to indicate that both fuses have blown.

In addition, the embodiments presented herein enable the soak current used to blow the fuse to be smaller, as compared to other fuse readout circuits. The smaller soak currents enable the sizes of the fuses to decrease and reduce the amount or size of the support circuitry for the fuse arrays. That is, in some systems, the fuse-array size is generally determined based on the individual fuse and gate selection device. These properties may affect a target soak current used to blow the fuses to a low resistance within reasonable test times. As number of fuses used on a semiconductor die increases, the area cost of the overall fuse-array increases and does not scale well. However, by using the differential fuse-readout circuit 12 detailed above, the circuit is capable of reading high resistance fuses accurately, thereby permitting the soak current to be scaled back and resulting in a reduced fuse footprint facilitating smaller fuse-array layout sizes. In this way, the differential fuse-readout circuit 12 may permit aggressive scaling of the fuse and gate select device layout footprint without sacrificing read accuracy. Compared to previous implementations, the differential fuse-readout circuit 12 described herein may read fuses up to six times higher resistance.

Moreover, by employing the differential fuse-readout circuit 12, the resolution in which the differential fuse-readout circuit 12 increases, thereby improving the speed in which the differential fuse-readout circuit 12 may read the state of each fuse. Indeed, this high-speed operation and simpler time-based margin testing may enable the differential fuse-readout circuit 12 to operate up to four times faster than previous fuse readout circuits. However, these improved systems and methods may still take a long amount of time to read a fuse state, for example, due to an amount of time used to charge at least a portion of a regenerative latch circuit to a switching threshold such that an output associated with the fuse state is able to be read.

Keeping the forgoing in mind, it is noted that reading fuse states using the differential fuse-readout circuit 12 takes a non-negligible amount of time. For instance, components of the fuse-readout circuit 12 are to charge and/or discharge to enable sensing of the fuse state. In this way, it may be desirable to provide systems and methods for improving (e.g., reducing) a duration of time used to perform a fuse-reading operation. One way to decrease an amount of time used to read the fuse states using the differential fuse-readout circuit 12 may be to pre-charge a portion of the differential fuse-readout circuit 12 to a voltage based on a switching voltage of the regenerative latch circuit 42. Precharging a portion of the differential fuse-readout circuit 12 to the voltage based on the switching voltage of the regenerative latch circuit 42 may improve reading durations since a time used to charge the regenerative latch circuit 42 to read the fuse state may decrease (e.g., charging may be relatively faster).

Figure 17:
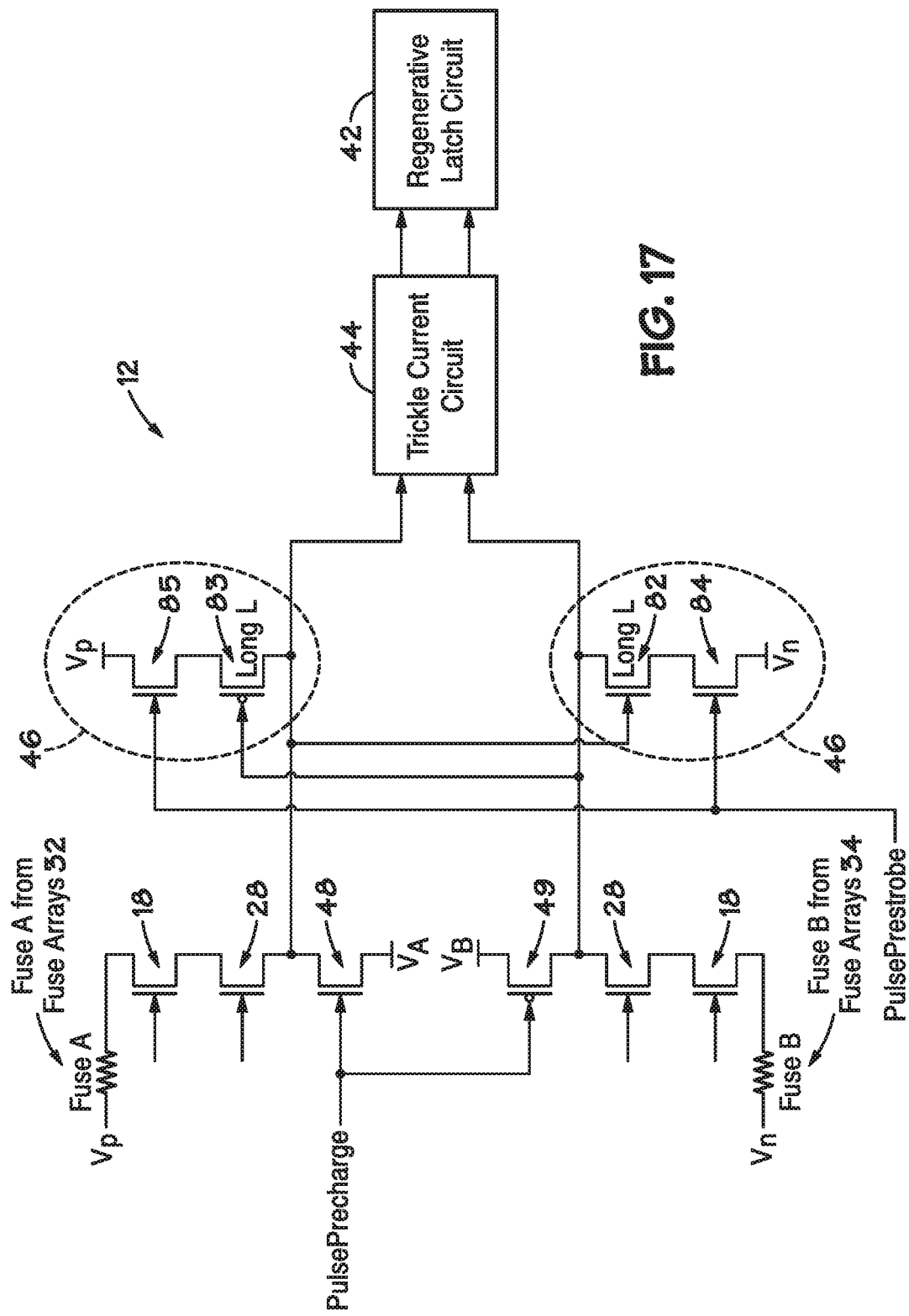
FIG. 17 illustrates circuit components that may be part of a third differential fuse-readout circuit in the electronic device of FIG. 1, according to an embodiment of the present disclosure.

To help explain, FIG. 17 illustrates circuit components that may be part of a third differential fuse-readout circuit 12 in the electronic device. In this example, the pre-charge devices 48 and 49 are coupled to voltages different from the positive and negative voltages coupled to Fuse A and Fuse B. The pre-charge device 48 is coupled to a first voltage source (Va) and the pre-charge device 49 is coupled to a second voltage source (Vb). The magnitude of the voltage generated by the first voltage source (Va) and the magnitude of the second voltage source (Vb) may be selected based on a switching voltage threshold of the regenerative latch circuit 42.

By way of operation, when a read fuse strobe signal 50 provided to the regenerative latch circuit 42 is off or low (e.g., 0), the voltage line 52 and the voltage line 54 that correspond to the voltages associated with the connected fuse cell 16 from fuse array 32 and fuse array 34, respectively, drift to voltages that correspond to the voltages of the connected fuse cell 16 from fuse array 32 and fuse array 34. The switching voltage threshold of the regenerative latch circuit 42 may correspond to which voltage received from the fuse array 32 and the fuse array 34 is to prompt a logical low output or a logical high output from the regenerative latch circuit 42. In this way, when a magnitude of the voltage received is above the switching voltage threshold, the regenerative latch circuit 42 may output a logical high output and when the magnitude of the voltage received is below the switching voltage threshold, the regenerative latch circuit 42 may output a logical low output. Thus, the first voltage source (Va) may be set to generate a voltage having a magnitude relatively lower than the switching voltage threshold but greater than 0 volts (V) (or another system logical low voltage level defined and/or used for at least a portion of the electronic device), and the second voltage source (Vb) may be set to generate a voltage having a magnitude relatively higher than the switching voltage but less than 1V (or another system logical high voltage level defined and/or used for at least a portion of the electronic device), as a way to provide a head-start to the switching and/or detection operation of the regenerative latch circuit 42.

For example, when the switching voltage threshold is 0.6, the first voltage source (Va) may have a magnitude equal to 0.5V and the second voltage source (Vb) may have a magnitude equal to 0.7V. This may reduce a duration of time used to sense fuse states since the regenerative latch circuit 42 is no longer charging from 0V to the switching voltage threshold or discharging from 1V to the switching voltage threshold. Instead, the regenerative latch circuit 42 is charging from a voltage of the first voltage source (Va) to the switching voltage threshold and/or discharging from a voltage of the second voltage source (Vb) to the switching voltage threshold.

To help elaborate on how the first voltage source (Va) and/or the second voltage source (Vb) are provided to the circuitry, FIG. 18 is a circuit diagram of an example of generation circuitry 126 coupled between the first voltage source (Va), the second voltage source (Vb), and the third differential fuse-readout circuit 12 of FIG. 17. The generation circuitry 126 electrically couples to the first voltage source (Va) and the second voltage source (Vb) and may include unity gain amplifiers 128 (128A, 128B) to buffer voltages received from the first voltage source (Va) and the second voltage source (Vb). In this way, each of the unity gain amplifiers 128 includes a feedback path that generally couples an output to an input of the amplifiers. The unity gain amplifiers 128 may be considered respective buffer circuities used to transmit a first voltage via a first voltage line and a second voltage via a second voltage line.

An output of the unity gain amplifiers 128 provides a control signal to transistors 130. For example, the unity gain amplifier 128A provides a control signal to the transistor 130A when generating an output voltage. The transistors 130 may operate to transmit a current when the unity gain amplifiers 128 operate to output a signal. For example, when the unity gain amplifier 128B receives the feedback from the transistor 130B and the second voltage source (Vb) signal, the unity gain amplifier 128B may output a difference between the magnitudes when the difference between the two signals is nonzero but may output 0V when the difference is zero, thus selectively operating the transistor 130B to transmit current when the voltage output of the transistor 130B is not substantially similar to the second voltage source (Vb) signal. Selective operation of the transistors 130 may reduce power consumption of some electronic devices using this system since the transistor 130 is a selectively conducting device and may consumed less power when not conducting.

Voltages received by the unity gain amplifiers 128 may be analog signals (e.g., analog voltages) from the first voltage source (Va) and the second voltage source (Vb). A resistor 132 may couple between outputs from the unity gain amplifiers 128 and/or the transistors 130 to reduce oscillation in voltages transmitted to the trickle current circuit 44 and/or to the differential fuse-readout circuit 12. This arrangement may permit the voltages transmitted to the trickle current circuit 44 to be generated from a bandgap between outputs of the unity gain amplifiers 128. It is noted that the generation circuitry 126 may be shared between multiple fuse-readout circuits 12. Signals transmitted to the trickle current circuit 44 may be used to bias coupling voltage lines to the first voltage provided by the first voltage source (Va) and/or to the second voltage provided by the second voltage source (Vb).

Figure 19:
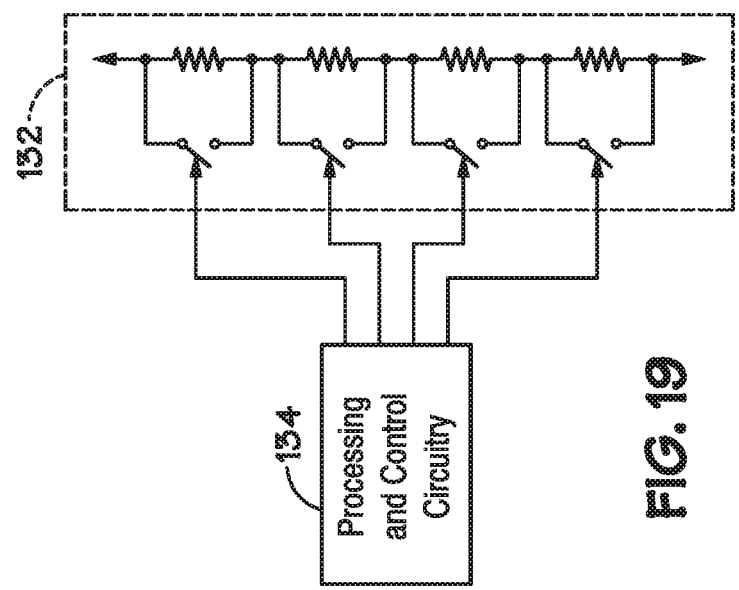
FIG. 19 is a circuit diagram of an example resistor of the generation circuitry of FIG. 18, according to an embodiment of the present disclosure.

As described above, the resistor 132 may sometimes be a programmable resistance value (e.g., programmable resistor). FIG. 19 is a circuit diagram of an example of the resistor 132. It is noted that the resistor 132 may be of any suitable type of resistance, and FIG. 19 represents one example of many suitable resistances. The resistor 132 may include a resistor stack of any number and size of resistors. For example, the resistor 132 may include four resistors coupled together in series. The individual resistors of the resistor 132 may couple to processing and control circuitry 134. The processing and control circuitry 134 may transmit control signals to toggle on or off resistances associated with each resistor of the resistor stack, such as to change an overall resistance value of the resistor 132. As described above, the resistor 132 may be used to reduce oscillations and/or improve signal quality in signals transmitted from the generation circuitry 126 to the trickle current circuit 44. In some examples, the resistor 132 is programmed in response to the processing and control circuitry 134 determining that the signal quality of the signals transmitted from the generation circuitry 126 degraded to the point of warranting correction (e.g., in response to a sensed amount of oscillation included by the first voltage output from the first voltage source (Va) and/or the second voltage output from the second voltage source (Vb)).

Figure 20:
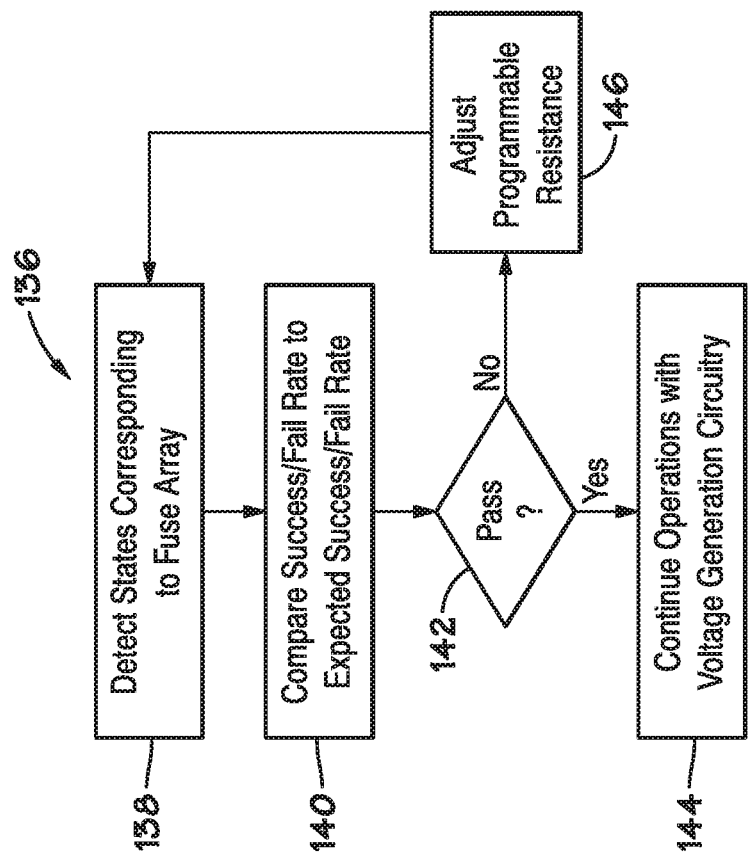
FIG. 20 is a flowchart of a process for determining when to adjust a resistance of the resistor of FIG. 19, according to an embodiment of the present disclosure.

FIG. 20 is a flowchart of a process 136 for determining when to adjust a resistance of the resistor 132. The processing and control circuitry 134 is described below as performing the process 136, but it should be understood that any suitable processing circuitry may additionally or alternatively perform the process 136. Furthermore, although the process 136 is described below as being performed in a particular order, it should be understood that any suitable order may be used to perform individual operations of the process 136.

At block 138, the processing and control circuitry 134 may detect states corresponding to states of the fuse array 14. As described generally above, this may include the processing and control circuitry 134 interpreting outputs from the differential fuse-readout circuit 12 to determine states of the fuses of the fuse array 14. When a threshold number of states of the fuses are detected, the processing and control circuitry 134, at block 140, may compare success or fail rates to what was expected as a result of the detection. For example, the processing and control circuitry 134 may know an expected distribution of fuse states (e.g., how many are working, how many have malfunctions, how many are disabled, quantity for logical high, quantity of logical low) and may use the expected distributions of fuse states to determine when detection quality has decreased relative to a previous detection quality (e.g., at an earlier time). At block 142, when the processing and control circuitry 134 determines that detection quality of the differential fuse-readout circuit 12 passes the comparison (e.g., a difference between expected and actual success/fail rates of the fuses is less than or equal to a threshold amount), the processing and control circuitry 134 may continue to use the differential fuse-readout circuit 12 with the generation circuitry 126 to detect states of the fuses of the fuse array 14, at block 144.

However, when the processing and control circuitry 134 determines that detection quality of the differential fuse-readout circuit 12 does not pass the comparison at block 140, the processing and control circuitry 134 may, at block 146, adjust the resistance of the resistor 132 in an attempt to improve detection quality. For example, the processing and control circuitry 134 may reference a look-up table, or a value otherwise stored and accessible, to determine an adjustment to make to the resistor 132 based on the difference between expected and actual success/fail rates of the fuses state detection operations, such as increasing the resistance of the resistor 132 in response to detecting that an oscillation is occurring in the output that is greater than a permissible oscillation threshold. The processing and control circuitry 134 may be part of a control loop that operates to adjust the resistance of the resistor 132 on a periodic or scheduled basis in response to a change in detection quality of differential fuse-readout circuit 12 that uses the generation circuitry 126. By adjusting the resistance of the resistor 132, signals transmitted from the generation circuitry 126 may improve and, for example, may include fewer oscillations or deviations from magnitudes of the first voltage source (Va) and the second voltage source (Vb) received by the generation circuitry 126.

Technical effects of the present disclosure include reduced detection durations used to sense a state of a fuse. When including generation circuitry with differential fuse read-out circuitry, such that voltages additional to system voltages are provided to the differential fuse read-out circuitry, a time duration of the fuse state detection may reduce. This may be at least in part due to a pre-charging operation to pre-charge voltages supplied to regenerative latch circuitry. Pre-charging the regenerative latch circuitry, such that the regenerative latch circuitry is at a voltage closer in magnitude to a switching voltage of the regenerative latch, may reduce a time used to change an output state of the regenerative latch circuitry since less time is used to get the regenerative latch circuitry to the switching voltage.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A circuit, comprising:
   a voltage line;
   latch circuitry characterized by a switching voltage threshold and coupled to the voltage line, wherein the latch circuitry is configured to generate an output used to determine a state of a fuse; and
   generation circuitry coupled to the latch circuitry via the voltage line, wherein the generation circuitry is configured to pre-charge the voltage line to a first voltage between a system logical high voltage and a system logical low voltage in response to a switch turning on to electrically couple the latch circuitry to a voltage source providing the first voltage.

2. The circuit of claim 1, comprising:
   an additional voltage line, wherein the generation circuitry is configured to pre-charge the additional voltage line to a second voltage between the system logical low voltage and the switching voltage threshold.

3. The circuit of claim 1, comprising a trickle current circuit configured to bias the voltage line to the first voltage.

4. The circuit of claim 1, comprising the fuse, wherein the fuse is part of a fuse array.

5. The circuit of claim 4, wherein the fuse comprises an anti-fuse.

6. The circuit of claim 1, wherein:
   the generation circuitry comprises:
      a first unity gain amplifier coupled between the voltage line and the voltage source; and
      a programmable resistor; and
   the generation circuitry is configured to generate the first voltage based at least in part on the programmable resistor.

7. The circuit of claim 6, comprising an additional voltage line, wherein the generation circuitry is configured to pre-charge the additional voltage line to a second voltage, wherein the programmable resistor electrically couples respective output paths from the first unity gain amplifier and a second unity gain amplifier of the generation circuitry to generate the first voltage and the second voltage.

8. The circuit of claim 1, wherein the generation circuitry is configured to generate the first voltage based at least in part on a programmable resistor, wherein the programmable resistor is programmed based at least in part on an amount of oscillation characterizing the first voltage.

9. A semiconductor device comprising:
   a differential fuse-readout circuit configured to detect a state of a fuse of a fuse array, wherein the differential fuse-readout circuit comprises a latch circuit characterized by a switching voltage threshold; and
   a control system configured to:
      send a pre-charge signal to the differential fuse-readout circuit, wherein the pre-charge signal is configured to turn on a switch to pre-charge a first voltage line associated with the fuse to a first voltage, wherein the first voltage is a value between a system logical low voltage and a system logical high voltage, and wherein the switch turning on electrically couples the latch circuit to a voltage source providing the first voltage; and
      send a read signal to the latch circuit configured to amplify a voltage signal present on the first voltage line, wherein the read signal is sent after the pre-charge signal is sent.

10. The semiconductor device of claim 9, wherein the control system is configured to send a pre-strobe signal to bias the first voltage line to the first voltage.

11. The semiconductor device of claim 10, comprising a generation circuit configured to generate the first voltage between the system logical low voltage and the switching voltage threshold.

12. The semiconductor device of claim 11, wherein the generation circuit comprises a unity gain amplifier configured to buffer the first voltage from an analog voltage source to the differential fuse-readout circuit.

13. The semiconductor device of claim 9, wherein the control system is configured to send a nicked fuse signal to a trickle current circuit configured to bias the first voltage line to the first voltage via a first switch.

14. The semiconductor device of claim 9, wherein sending the pre-charge signal to the differential fuse-readout circuit is configured to pre-charge a second voltage line associated to a second voltage between the system logical high voltage and the switching voltage threshold.

15. The semiconductor device of claim 14, comprising generation circuitry that includes respective buffer circuitries to transmit the second voltage on the second voltage line and the first voltage on the first voltage line.

16. A method, comprising:
  programming a programmable resistance based at least in part on a sensed amount of oscillation that a first voltage comprises, wherein adjusting a resistance of the programmable resistance is configured to adjust the first voltage;
  transmitting a pre-charge signal to a differential fuse-readout circuit, wherein the pre-charge signal is configured to pre-charge a first voltage line associated with a fuse to the first voltage between a system logical low voltage and a switching voltage threshold associated with the differential fuse-readout circuit; and
  transmitting a read signal to a latch circuit configured to amplify a voltage signal present on the first voltage line, wherein the read signal is sent after the pre-charge signal is sent.

17. The method of claim 16, comprising generating the first voltage at least in part by supplying generation circuitry with the system logical low voltage, a system logical high voltage, the first voltage, and a second voltage, wherein transmitting the pre-charge signal to the differential fuse-readout circuit is configured to pre-charge a second voltage line associated with the fuse to the second voltage between the system logical high voltage and the switching voltage threshold.

18. The method of claim 17, comprising pre-charging the second voltage line at a same time as pre-charging the first voltage line.

19. The method of claim 17, wherein transmitting the pre-charge signal to the differential fuse-readout circuit comprises driving the differential fuse-readout circuit using the first voltage generated by the generation circuitry based at least in part on an output from a unity gain amplifier.

20. The method of claim 16, comprising generating the first voltage based at least in part on a current transmitted through the programmable resistance separating unity gain amplifiers of generation circuitry.

* * * * *